US007131097B1

(12) United States Patent
Schlacter

(10) Patent No.: US 7,131,097 B1
(45) Date of Patent: Oct. 31, 2006

(54) LOGIC GENERATION FOR MULTIPLE MEMORY FUNCTIONS

(75) Inventor: Guy R Schlacter, Buffalo Grove, IL (US)

(73) Assignee: Altera Corporation, San Jose, CA (US)

( * ) Notice: Subject to any disclaimer, the term of this patent is extended or adjusted under 35 U.S.C. 154(b) by 341 days.

(21) Appl. No.: 10/253,379

(22) Filed: Sep. 24, 2002

(51) Int. Cl.
*G06F 17/50* (2006.01)
*G06F 7/38* (2006.01)

(52) U.S. Cl. .................. 716/16; 716/1; 716/8; 716/18; 326/37; 326/38

(58) Field of Classification Search .................. 716/16, 716/1, 8, 18
See application file for complete search history.

(56) References Cited

U.S. PATENT DOCUMENTS

| 3,622,762 | A * | 11/1971 | Dyer et al. ..................... 716/4 |
| 5,210,701 | A * | 5/1993 | Hana et al. ..................... 716/1 |
| 5,377,122 | A * | 12/1994 | Werner et al. ................. 716/18 |
| 5,623,684 | A * | 4/1997 | El-Ghoroury et al. ........ 712/37 |
| 5,768,562 | A * | 6/1998 | Heile et al. .................. 717/168 |
| 5,867,400 | A * | 2/1999 | El-Ghoroury et al. ......... 716/1 |
| 5,933,350 | A * | 8/1999 | Fujimoto et al. ........... 700/121 |
| 6,023,565 | A | 2/2000 | Lawman et al. |
| 6,026,220 | A | 2/2000 | Cleereman et al. |
| 6,118,938 | A * | 9/2000 | Lawman et al. .............. 716/16 |
| 6,120,549 | A | 9/2000 | Goslin et al. |
| 6,173,245 | B1 | 1/2001 | Karchmer et al. |
| 6,216,258 | B1 * | 4/2001 | Mohan et al. ................. 716/17 |
| 6,256,683 | B1 * | 7/2001 | Barry ......................... 710/26 |
| 6,401,230 | B1 * | 6/2002 | Ahanessians et al. .......... 716/1 |
| 6,453,367 | B1 * | 9/2002 | Barry ......................... 710/26 |
| 6,510,548 | B1 * | 1/2003 | Squires ....................... 716/16 |
| 6,634,009 | B1 * | 10/2003 | Molson et al. ................. 716/1 |
| 6,658,633 | B1 * | 12/2003 | Devins et al. ................. 716/5 |
| 6,698,002 | B1 * | 2/2004 | Chang et al. .................. 716/4 |
| 6,883,147 | B1 * | 4/2005 | Ballagh et al. ................ 716/1 |
| 6,891,395 | B1 * | 5/2005 | Wells et al. .................. 326/38 |
| 7,069,523 | B1 * | 6/2006 | Nation et al. .................. 716/2 |
| 2002/0059554 | A1 * | 5/2002 | Takemura ..................... 716/8 |
| 2003/0009612 | A1 * | 1/2003 | Latta ......................... 710/240 |
| 2003/0076723 | A1 * | 4/2003 | Zarrineh et al. ............ 365/201 |
| 2003/0229877 | A1 * | 12/2003 | Bersch et al. ................ 716/16 |
| 2005/0149898 | A1 * | 7/2005 | Hakewill et al. ............. 716/18 |

OTHER PUBLICATIONS

S. Mohanty et al., SCUBA: An HDL Data-Path/Memory Module Generator for FPGA's, Proceedings of VHDL International Users' Forum, pp. 135-142, Oct. 1997.*

S. Mohanty et al., SCUBA: An HDL Data-Path/Memory Module Generator for FPGAs, Proceedings of VHDL International Users' Forum, pp. 135-142, Oct. 1997.*

(Continued)

*Primary Examiner*—A. M. Thompson
(74) *Attorney, Agent, or Firm*—Fish & Neave IP Group Ropes & Gray LLP

(57) ABSTRACT

Methods are provided for helping to automate the design of electronic circuitry in which multiple memory functions are provided by common physical memory. Interactive computer screens prompt the user to enter information about the multiple memory functions that the user desires. The data thus entered by the user is then reformatted for use as specific values of parameters in a parameterized function that can provide the required circuit design when its parameters are thus supplied with specific values.

8 Claims, 13 Drawing Sheets

OTHER PUBLICATIONS

Draft Developer's Documentation sent to Developers with Sample Code For Testing, Dec. 19, 1997. ("MegaWizard® Plug-In Manager-Megafunction Wizards Information Exchange Requirements").

Press Release from Altera Corporation, Altera's Mega Wizard Plug-Ins Offer the First Too-Independent Parameterized Logic Cores, Feb. 2, 1998.

"A Developers Guide to the Design of MegaWizard® Megafunction Wizards," Documentation for Developers Provided with Final Product Release, Jun. 30, 1998.

"Mega Wizard Plug-Ins," provided on Altera Corporation's World Wide Web Home Page (www.altera.com), prior to Jan. 11, 1999.

"Altera Megafunctions," provided on Altera Corporation's World Wide Web Home Page (www.altera.com), prior to Jan. 11, 1999.

"AMPP Megafunction: Telephone Tone Generation Megafunction," provided on Altera Corporation's World Wide Web Home Page (www.altera.com), prior to Jan. 11, 1999.

"Introduction to Megafunctions," provided on Altera Corporation's World Wide Web Home Page (www.altera.com), prior to Jan. 11, 1999.

PowerPoint® presentation describing "Megafunction Wizard" functionality made Nov. 1997.

* cited by examiner

MEMORY CONFIGURATION

HOW SHOULD THE RAM BE CONFIGURED?

○ AS INDEPENDENT FIFOS AND/OR DUAL-PORT RAMS

○ AS MULTIPLE FIFOS WITH A SINGLE COMMON READ PORT (FIFO N:1)

○ AS MULTIPLE FIFOS WITH A SINGLE COMMON WRITE PORT (FIFO 1:N)

○ AS MULTIPLE DUAL-PORT RAMS WITH A SINGLE COMMON WRITE PORT (DPRAM N:1)

○ AS MULTIPLE DUAL-PORT RAMS WITH A SINGLE COMMON READ PORT (DPRAM 1:N)

GLOBAL CONFIGURATIONS

HOW MANY FIFOS WOULD YOU LIKE?

HOW MANY DUAL-PORT RAMS WOULD YOU LIKE?

☐ USE THE SAME CONFIGURATION FOR ALL VIRTUAL ELEMENTS

☐ CREATE AN ASYNCHRONOUS CLEAR

☐ MAKE IT ACTIVE LOW

JUMP TO PAGE FOR:

RAM STATUS (RIGHT CLICK FOR MORE OPTIONS)

| VIRTUAL ELEMENT | WRITE | READ |
|---|---|---|
| 1 FIFO | 10 | 10 |
| 2 FIFO | 5 | 15 |
| 3 DPRAM | 20 | 20 |
| 4 DPRAM | 50 | 20 |

WRITE FREQUENCY  85

READ FREQUENCY  65

TDM CLOCK FREQUENCY RANGE, ETC, ETC

PORT 3 OF 4

PORT AND MEMORY SIZE

HOW WIDE SHOULD THE DATA INPUT BUS BE? [▷] BITS

☐ USE DIFFERENT BUS WIDTH ON THE DATA OUTPUT

HOW WIDE SHOULD THE DATA OUTPUT BUS BE? [▷] BITS

HOW MANY X-BIT WORDS? [▷]

CLOCKS AND FREQUENCIES

WHAT IS THE WRITE CLOCK FREQUENCY? [    ] MHZ

☐ USE DIFFERENT CLOCK ON THE READ PORT

WHAT IS THE READ CLOCK FREQUENCY? [    ] MHZ

DUAL-PORT RAM OPTIONS

☐ CREATE A CLOCK ENABLE SIGNAL FOR THE READ CLOCK

☐ REGISTER OUTPUT (ONLY IN DPRAM N:1 MODE)

☐ CREATE A BYTE ENABLE PORT

WHAT IS THE WIDTH OF A BYTE FOR THE BYTE ENABLE? [▷] BITS

JUMP TO PAGE FOR: [▷  ]

RAM STATUS

(RIGHT CLICK FOR MORE OPTIONS)

| DPRAM 1:N PORTS | WRITE | READ |
|---|---|---|
| 1 COMMON BUS PORT | 100 | 10 |
| 2 READ PORT | | 30 |
| 3 READ PORT | | 30 |
| 4 READ PORT | | |

WRITE FREQUENCY [ 100 ]

READ FREQUENCY [ 70 ]

TDM CLOCK FREQUENCY RANGE, ETC, ETC

LOGIC GENERATION FOR MULTIPLE MEMORY FUNCTIONS

BACKGROUND OF THE INVENTION

This invention relates to utilization of electronic memory, and more particularly to automating the sharing of a physical memory by several functional circuits, each of which may have its own memory needs that may be asserted in parallel.

Programmable logic integrated circuit devices ("PLDs") typically have many regions of programmable logic that are interconnectable in any of many possible ways by programmable interconnection resources. PLDs also typically include input/output resources that are used via the programmable interconnection resources. It has also become quite common to include blocks of memory on PLDs. The PLD may use such memory as random access memory ("RAM"), read-only memory ("ROM"), or other types of memory. For example, with suitable additional control circuitry, such memory may be used as first-in/first-out ("FIFO") memory. The additional control circuitry may be implemented in the programmable logic of the PLD.

Because of the extremely large logic capabilities of many PLDs, such PLDs are often used to perform multiple functions simultaneously, or at least partly or substantially simultaneously. Each of these functions may have its own requirements for supporting memory. Because the PLD is typically a generic device that is intended to satisfy many possible uses, the details of which are not known in advance by the PLD manufacturer, it is difficult to provide PLDs with memory blocks in the numbers and sizes that will meet the memory needs of the many functions that the PLD user may want to have the PLD perform. Also, for reasons of economy, there is interest in providing relatively large blocks of memory on PLDs, rather than providing many relatively small memory blocks. However, when this is done, the user may be burdened with the task of figuring how to have several functions share one large memory.

Although up to this point this background has been provided in the context of memory on PLDs, it will be understood that the same problem may arise in other contexts such as PLDs using external memory, application-specific integrated circuits ("ASICs") using on-board or external memory, systems of multiple integrated circuits or other components sharing memory, etc. This invention can be used to help solve the problem of sharing physical memory in any of the various contexts in which it may arise. For simplicity and convenience herein, the invention will be illustratively described, for the most part, in its application to PLDs with on-board memory. But from this description, those skilled in the art will fully understand how the invention can be applied in many other contexts.

SUMMARY OF THE INVENTION

In one of its aspects the invention relates to automating or at least helping to automate the design of interface circuitry that can be used between multiple functional circuits (each with its own memory needs) and a physical memory block, the interface circuitry allowing the physical memory block to satisfy the memory needs of all the functional circuits. The user supplies certain characteristics of the functional memory needed to support each functional circuit. The user may also supply some information regarding the overall functional memory requirements of the functional circuits relative to themselves and each other. Alternatively or in addition, such overall inter-functional memory information is automatically determined from the individual functional memory characteristics supplied by the user. Data from the preceding steps is formatted for use as the values of parameters in parameterized software that, when executed with parameter values, is capable of calculating other needed values and specifying the circuitry (e.g., the logic functions and interconnect) needed to provide an interface between all the functional circuits and the common or shared physical memory block or blocks.

If it is desired to continue on to actually configuring a PLD or other system, the circuitry specified as a result of performing the foregoing steps may be combined with other circuit design information (e.g., that required to implement the above-mentioned functional circuits). The total circuit design is then processed in a conventional way to produce data that can be used to actually configure (program) a PLD or implement any other type of system.

Further features of the invention, its nature and various advantages, will be more apparent from the accompanying drawings and the following detailed description of the preferred embodiments.

BRIEF DESCRIPTION OF THE DRAWINGS

FIG. 5 is an illustrative embodiment of a computer screen in accordance with the invention for facilitating data entry useful in accordance with the invention.

FIG. 10 is an illustrative embodiment of another computer screen in accordance with the invention for facilitating data entry useful in accordance with the invention.

FIG. 11 is an illustrative embodiment of still another computer screen in accordance with the invention for facilitating data entry useful in accordance with the invention.

DETAILED DESCRIPTION

Figure 1:
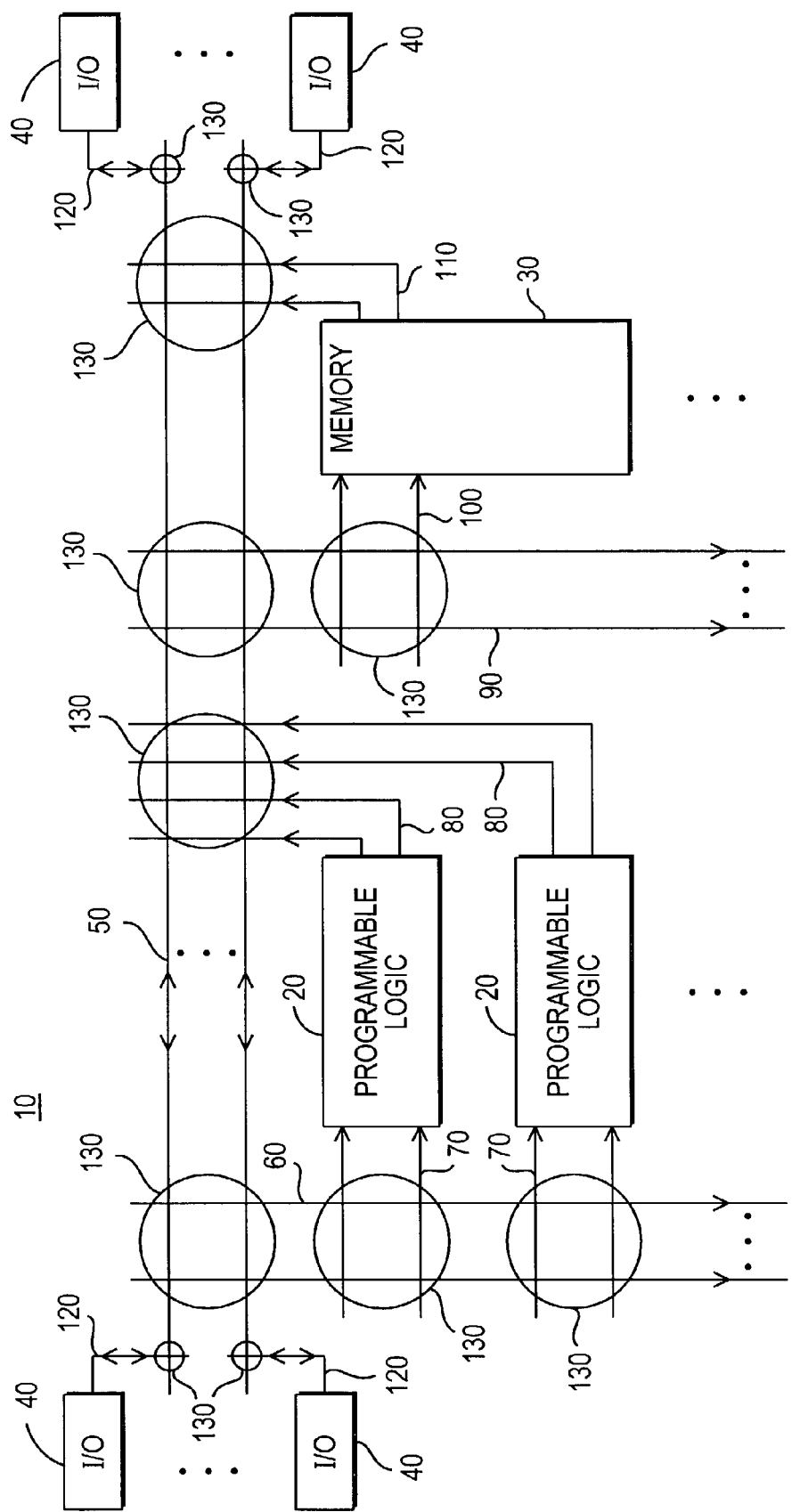
FIG. 1 is a simplified schematic block diagram of a representative portion of an illustrative PLD architecture with which the invention can be used.

An illustrative organization of a PLD 10 is shown in FIG. 1. As shown there, PLD 10 includes a plurality of regions of programmable logic 20, one or more regions of memory 30, and a plurality of input/output ("I/O") circuits 40. These elements are interconnectable in many different ways by programmable interconnection resources that include such components as plural horizontal interconnection conductors 50, plural logic region feeding conductors 60, plural logic region input conductors 70, plural logic region output conductors 80, plural memory region feeding conductors 90, plural memory region input conductors 100, plural memory region output conductors 110, plural I/O circuit connection conductors 120, and plural programmable logic connectors ("PLCs") 130 for making programmably selectable connections between various ones of these conductors. Logic regions 20 are programmable by a user of PLD 10 to perform any of a wide range of logic functions. Some of these logic functions may involve the use of memory, and in that case memory regions 30 are available to provide such memory. I/O circuits 40 are provided for interfacing PLD 10 with external circuitry. Data can be routed to, from, and/or between the various elements 20, 30, and 40 in many different ways by appropriately programming PLCs 130 to make or not make connections between the various ones of conductors 50, 60, 70, 80, 90, 100, 110, and 120.

It will be understood that FIG. 1 has been greatly simplified, and that PLD 10 may also include other elements and other types of elements that are not shown in FIG. 1. For example, PLD 10 may include plural memory regions 30 of plural different sizes. As another example, PLD 10 may also include various specialized functional circuits, such as one or more microprocessors, multipliers, multiplier-accumulators, etc. It will also be understood that FIG. 1 shows only one of the many known organizations ("architectures") for PLDs, and that the invention is equally applicable to most, if not all, of the known PLD architectures (as well as to non-PLD circuits and systems, as was mentioned in the background section of this specification).

Figure 2:
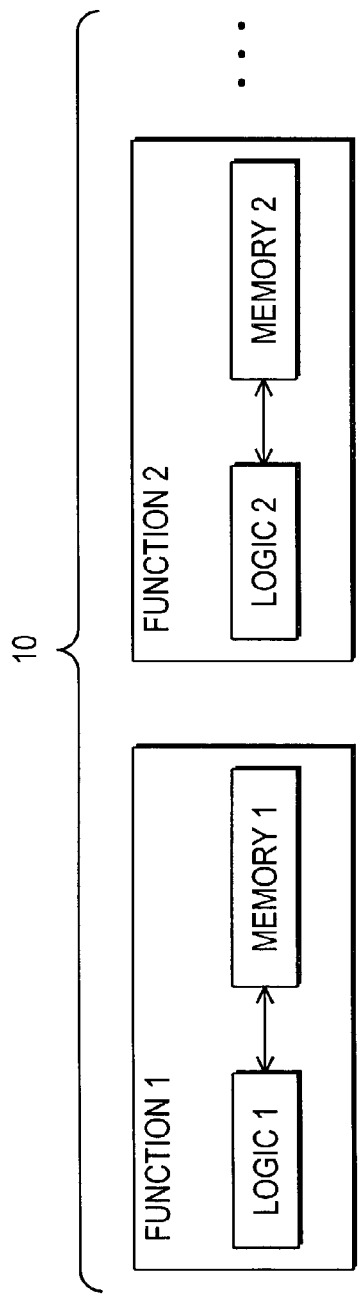
FIG. 2 is a simplified functional block diagram showing an illustrative use of a PLD of the general type illustrated by FIG. 1.

FIG. 2 illustrates a typical use of PLD 10. Whereas FIG. 1 is an architecture-oriented depiction of PLD 10, FIG. 2 is a more functionally oriented depiction of the PLD. In the particular use of PLD 10 shown in FIG. 1, the PLD has been programmed to perform several functions ("function 1", "function 2", etc.). Each of these functions is implemented by a portion of the PLD's programmable logic resources (20 in FIG. 1; "logic 1", "logic 2", etc. in FIG. 2). In addition, each function makes use of a portion of the PLD's memory resources (30 in FIG. 1; "memory 1", "memory 2", etc. in FIG. 2). Thus FIG. 2 shows the logic and memory for each function exchanging signals with one another via associated portions of the PLD's interconnection resources (50/60/70/ etc. in FIG. 1).

FIG. 2 suggests that each function has its own block of dedicated physical memory. Such implementations can be problematic for any of several reasons. For example, the available number and sizes of the memory regions 30 (FIG. 1) may not be well matched to the memory needs of the various functions to be implemented when those functions are considered individually. On the other hand, the burden on the user of designing the additional logic and interconnect required to enable multiple functions to share common physical memory can be quite heavy. Moreover, such additional logic and interconnect tends to be very specific and not reusable if any significant change occurs in any of the functions sharing physical memory. Nevertheless, providing relatively large blocks of memory 30 tends to be more economical than providing many small blocks of memory, which is a consideration that tends to promote the use of shared physical memory.

Figure 3:
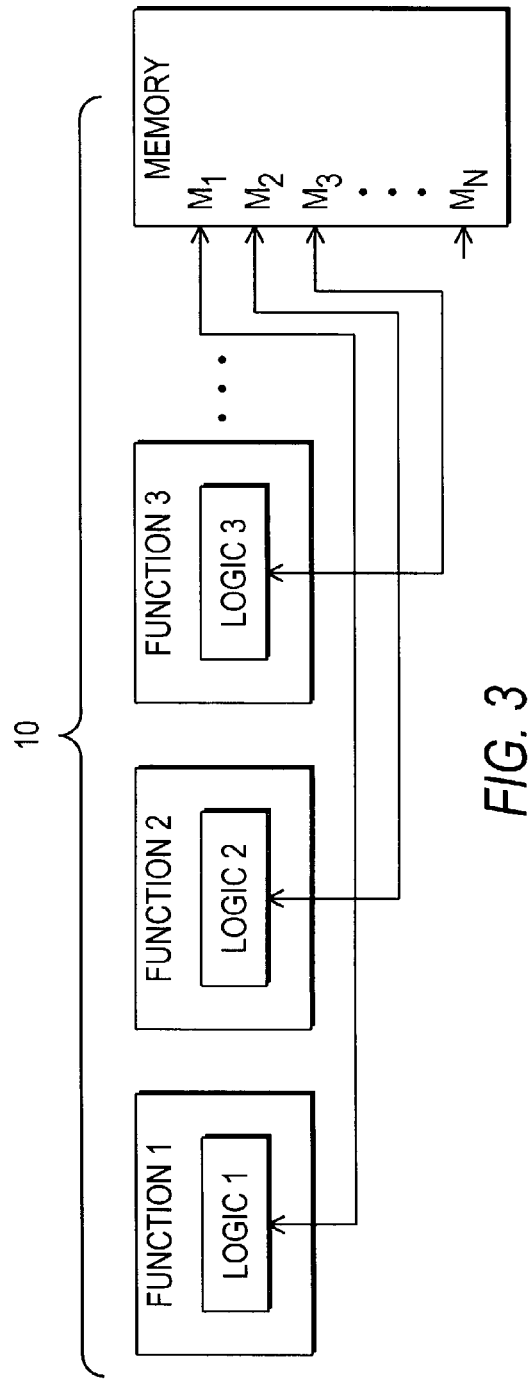
FIG. 3 is a simplified functional block diagram showing an alternative configuration of what is shown in FIG. 2 that can be achieved with the aid of this invention.

FIG. 3 shows PLD 10 programmed with the same overall functionality as FIG. 2. In FIG. 3, however, the programmable logic circuits of functions 1, 2, 3, etc. all share one common physical memory. This allows one large block of physical memory to provide the functional memory needed by several functions. If this is done, PLD 10 can be provided with a smaller number of larger blocks of memory, which is a more efficient way for memory to be provided on a PLD.

It should be mentioned that, like FIG. 2, FIG. 3 is primarily functional in nature. FIG. 3 should therefore not be understood to suggest that each function has its own port(s) for accessing the shared physical memory. Rather, it is more typical for the multiple functions to share the ports of the physical memory, with the information storage capacity of the memory partitioned among the various functions using the memory. The above-mentioned memory port sharing can be by partitioning, by time-division multiplexing ("TDM"), or by both partitioning and TDM.

From FIG. 3 and the foregoing discussion it will be apparent that additional logic must be designed to enable the logic of functions 1, 2, 3, etc. to share common physical memory. For example, this additional logic is needed for such purposes as to provide appropriate sharing of the ports of the common memory, to provide appropriate addressing of the information storage circuits of the common memory so that those storage circuits will be appropriately partitioned among the various functions using the common memory, etc. As has been said, the task of designing this additional logic can be quite burdensome for the user of the PLD. Moreover, this additional logic tends to be unique to the particular functions sharing the common physical memory. Hence the design of any particular additional logic is not likely to be reusable if any significant change is made in any of the functions sharing the common memory.

An objective of this invention is to automate or at least help to automate the design of the additional logic needed to enable multiple functions to share a common physical memory. (It will be understood that logic generally needs appropriate associated interconnect in order to be useful. Rather than always mentioning both logic and the associated interconnect herein, only logic will sometimes be mentioned. But the reader will understand that the associated inconnect is also implied and intended by such references to "logic".)

Figure 4:
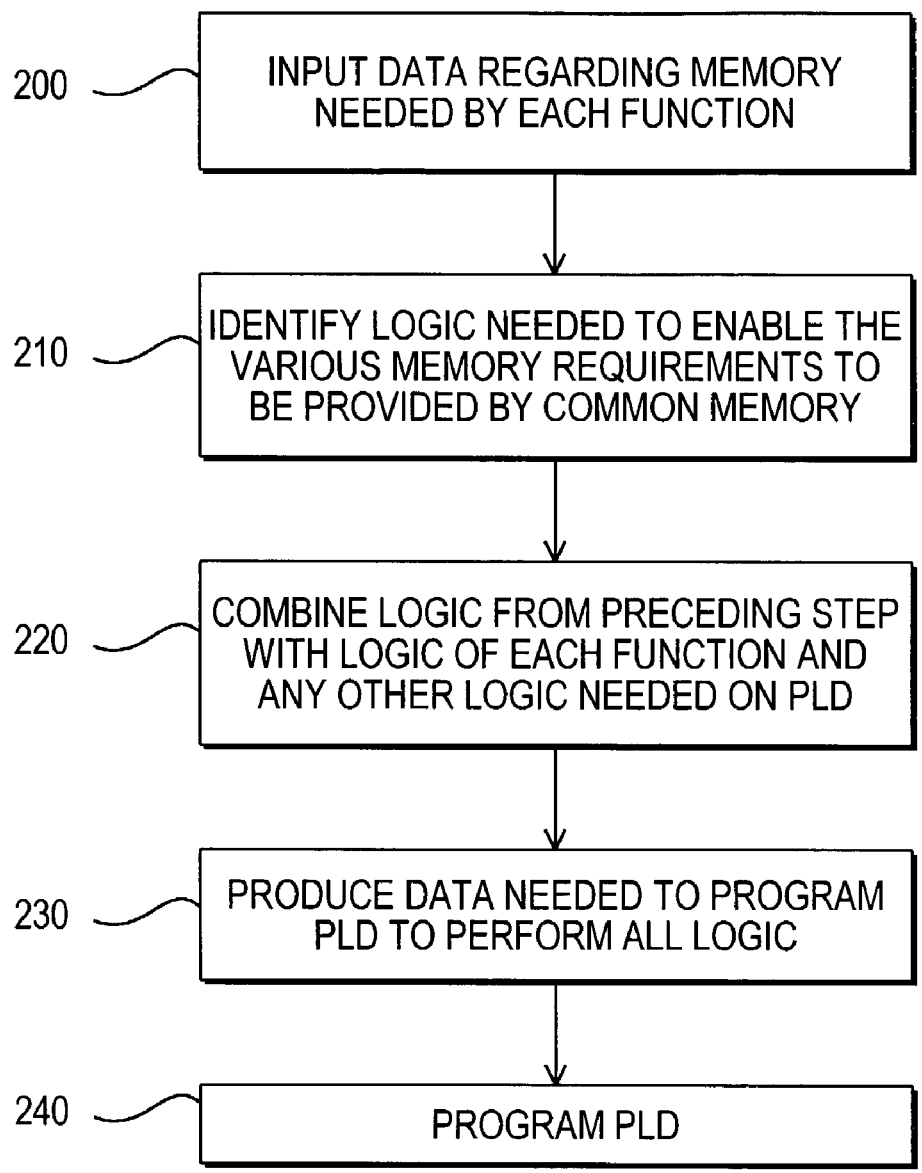
FIG. 4 is a simplified flow chart of an illustrative embodiment of a method in accordance with this invention.
Figure 15:
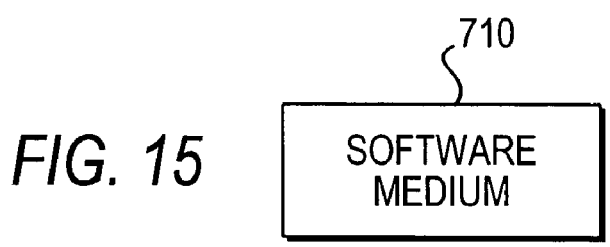
FIG. 15 is a simplified block diagram of an illustrative software medium for software usable in accordance with the invention.

FIG. 4 is a flow chart showing an illustrative embodiment of certain aspects of the invention. In particular, FIG. 4 is a flow chart of an illustrative method (preferably including software) for automating the design of the additional logic that is needed on a PLD to allow several functions that the PLD will perform to share common memory. FIG. 4 then goes on to show how that additional logic can be combined with other logic needed on the PLD in order to provide a complete design for and ultimately a programmed PLD. It will be understood that some or all of the software employed in the methods of this invention (e.g., as illustrated by FIG. 4) may be stored on software media such as CD ROM, magnetic disc or tape, computer memory (RAM or ROM), etc. FIG. 15 is a generic depiction of such a software medium 710.

In step 200 the user inputs data into the software to supply to the software information about the memory needed by each function requiring memory. Details regarding the types of data entered in step 200 will be discussed in connection with several subsequent FIGS.

In step 210 the data from step 200 is used to identify the logic needed to enable the various functional memory requirements to be provided by a common physical memory. Step 210 includes using the data from step 200 to create the individual functional memories. Step 210 may also include making use of certain inter-function data. Such inter-function data may be entered in whole or in part by the user in step 200, or it may be calculated in whole or in part in step 210 (using individual function data supplied in step 200) to meet the combined, new functional need.

In step 220 the logic identified in step 210 is combined with other logic needed in the PLD (e.g., the logic needed to concurrently perform the various logic functions that the PLD will perform).

In step 230 the entire design of the PLD from step 220 is converted to the data needed to actually program the PLD. And in step 240 the data from step 230 is used to program the PLD.

FIG. 5 shows an illustrative computer screen (graphical display) 310 that can be the first of several such screens via which a user can enter data regarding the functional memory needs of several memory functions so that the computer (performing, for example, the steps shown in FIG. 4) can determine how these functional memory needs can be supported by common physical memory. In the upper left-hand portion of the computer screen shown in FIG. 5 the user can select any one of five options regarding how the memory is to be configured. The various options shown in the upper left-hand portion of FIG. 5 reflect some limitations on the types of memory functions the illustrative embodiment can support, and also some limitations on the combinations of those memory functions that the illustrative embodiment can support. The invention will be fully understood from the illustrative embodiment, and it will also be understood how other embodiments can be provided that alternatively or additionally support other types and combinations of memory.

The first of the options shown in the upper left-hand portion of FIG. 5 is configuring the memory to support independent first-in/first-out ("FIFO") memories and/or dual-port random access memories ("DPRAMs"). A FIFO memory is a conventional type of memory that can store successive data items (e.g., data words), and that in any read operation reads out the oldest previously unread data item stored in the memory. After a data item has been read, it is generally no longer readable from a FIFO. A DPRAM is a RAM that is capable of independent read and write operations. In other words, a data item can be written to any location in a DPRAM at the same time that another data item is being read from any other location in the DPRAM. (In the illustrative embodiment being discussed, a DPRAM has one read port independent from one write port. RAMs with two read ports and two write ports are also known, and it will be understood from the discussion herein how such "true dual-port RAMs" can also be supported by the invention if desired. Another known type of RAM that can be supported by the invention if desired is "single-port RAMs". Single port RAMs have only one port that is used for both writing to and reading from the RAM.) Selection of the first option in the upper left-hand portion of FIG. 5 means that each FIFO and/or DPRAM the user subsequently specifies will be configured to operate independently of all other FIFOs and/or DPRAMs the user specifies. This means that the read and write ports of all of these memories will be independent of one another.

Figure 6:
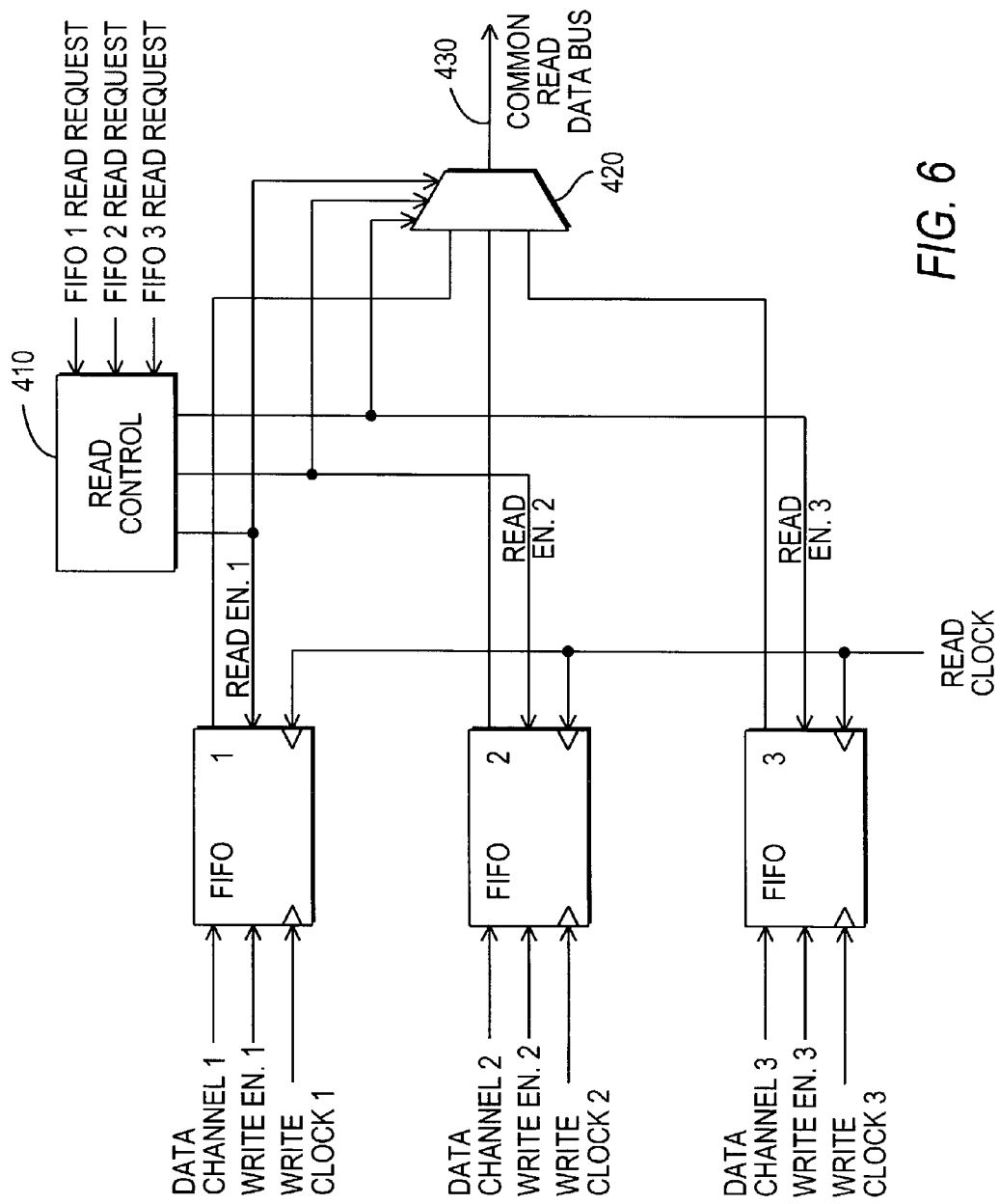
FIG. 6 is a simplified schematic block diagram of an illustrative memory structure that can be implemented in accordance with the invention.

The second option in the upper left-hand portion of FIG. 5 allows the user to specify that multiple FIFOs subsequently specified have separate write ports but a common read bus, and thus can use a common read data port. FIG. 6 shows an example of this type of FIFO arrangement. As shown there, FIFO 1 receives data from data channel 1 and (if enabled by a write enable 1 signal) stores that data in synchronism with write clock 1 (e.g., a 33 MHz clock signal). FIFO 2 receives data from data channel 2 and (if enabled by a write enable 2 signal) stores that data in synchronism with write clock 2 (e.g., another 33 MHz clock signal). FIFO 3 is yet another FIFO similar to FIFO 1 and FIFO 2. On the read side, read control logic 410 (responsive to FIFO 1–3 read request signals) determines which one of FIFOs 1–3 will be read at any particular time. The FIFO enabled via the associated one of read enable signals 1–3 is read in synchronism with a common read clock signal (e.g., a 100 MHz clock signal). Multiplexer 420 is also controlled by read enable signals 1–3 to connect only the output of the currently enabled FIFO to common output bus 430.

From the user's perspective the circuitry of FIG. 6 is just three FIFOs sharing a common read data bus. The user really only needs to think in functional terms, i.e., about the three functional FIFOs 1–3 and their functional inputs and outputs. The present invention takes care of automatically interleaving inputs from three different data channels into one common physical memory and then appropriately reading data out of that common physical memory onto common read data bus 430. (After the following discussion of FIGS. 7–9 it will be understood that the preceding three sentences can be generalized as follows: From the user's perspective the N:1 or 1:N circuitry of any of FIGS. 6–9 or the like is just N functional memories or FIFOs sharing a common data bus. The user really only needs to think in functional terms, i.e., about the N functions (such as FIFOs 1–3 or DPRAMs 1–3) and their functional inputs and outputs. The present invention takes care of automatically interleaving inputs from N different data channels into one common physical memory or similarly automatically interleaving outputs from one common physical memory onto N different data channels. For example, in FIG. 7 inputs are interleaved from three data input channels onto the one common physical write port, and in FIG. 6 outputs from the physical read port are interleaved onto shared data bus 430.)

Figure 7:
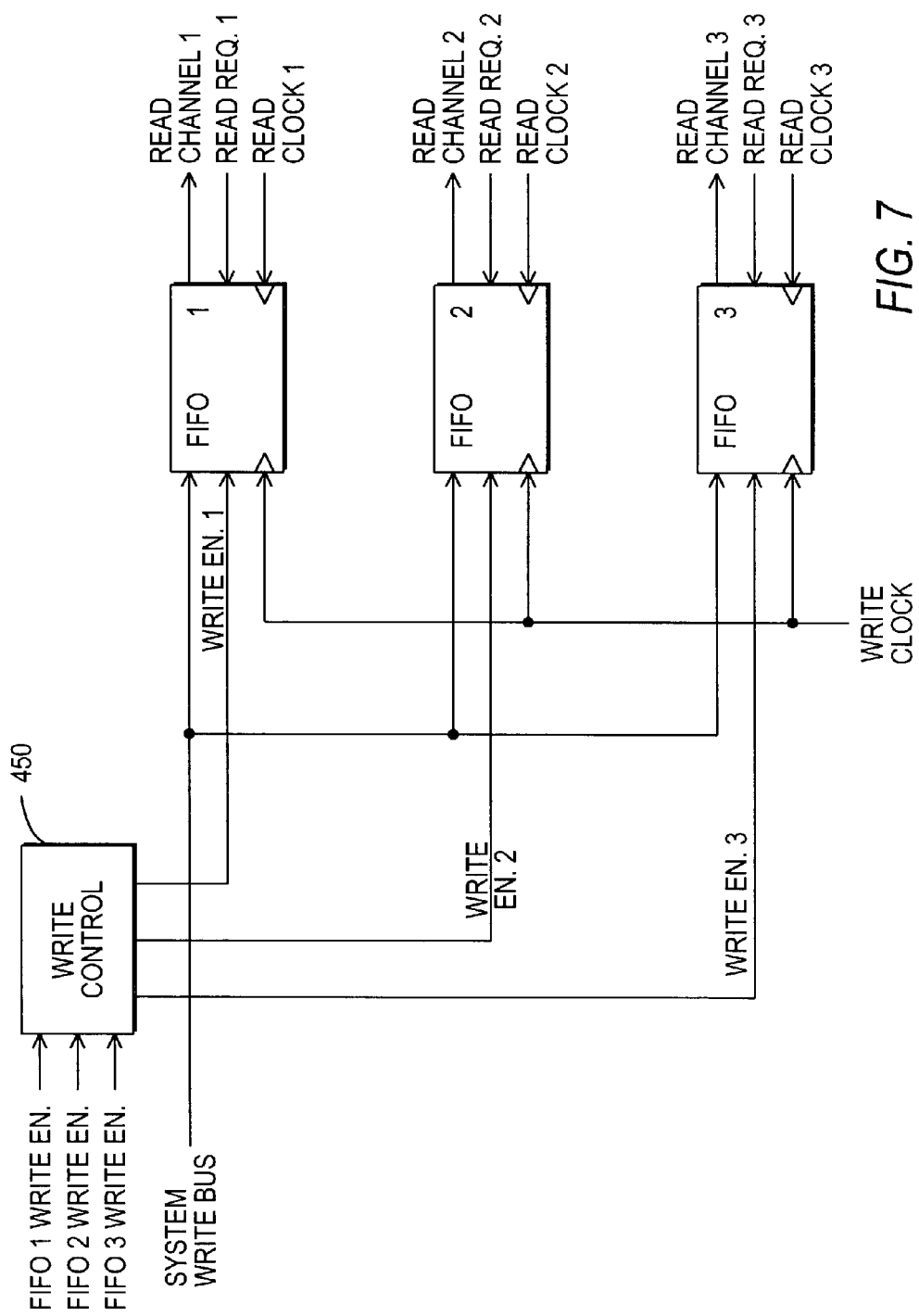
FIGS. 7–9 are similar to FIG. 6 for other illustrative memory structures that can be implemented in accordance with the invention.

Returning to FIG. 5, the third option in the upper left-hand portion of screen 310 allows the user to specify that multiple FIFOs subsequently specified have a common write bus but separate read ports. FIG. 7 shows an example of this type of FIFO arrangement. As shown there, write control logic 450 (responsive to FIFO 1–3 write enable signals) enables any one of FIFOs 1–3 to receive and store data from the system write bus at any given time. Writing actually takes place in synchronism with the write clock signal (e.g., a 100 MHz clock signal). Each of FIFOs 1–3 is read (when enabled by the associated read request 1–3 signal) in synchronism with its own respective read clock signal 1–3, and outputs data to its own respective read channel 1–3. Each of read clock signals 1–3 may be, for example, a 33 MHz clock signal.

Figure 8:
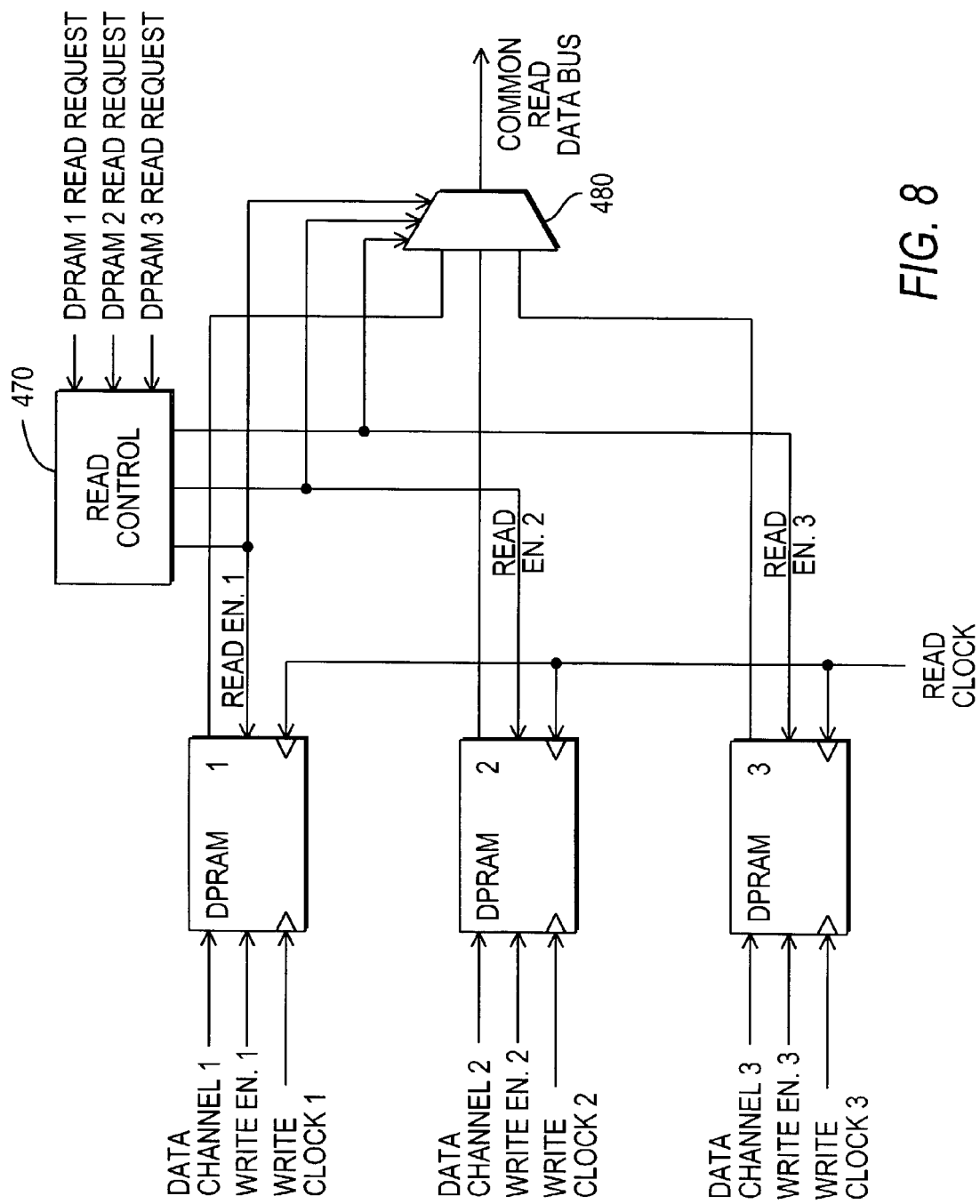

Returning again to FIG. 5, the fourth option in the upper left-hand portion of screen 310 allows the user to specify that multiple DPRAMs subsequently specified have separate write ports but a common read port. FIG. 8 shows an example of this type of DPRAM arrangement. It will be seen that FIG. 8 is similar to FIG. 6, with DPRAMs 1–3 substituted for FIFOs 1–3 and with elements 470 and 480 taking the place of elements 410 and 420, respectively. Operation of the FIG. 8 circuitry is therefore somewhat similar to operation of the FIG. 6 circuitry, the major exception being that in FIG. 6 read and write addresses for FIFOs 1–3 are typically generated by counters associated with those FIFOs, whereas in FIG. 8 read and write addresses for DPRAMs 1–3 can come from non-counter sources.

Figure 9:
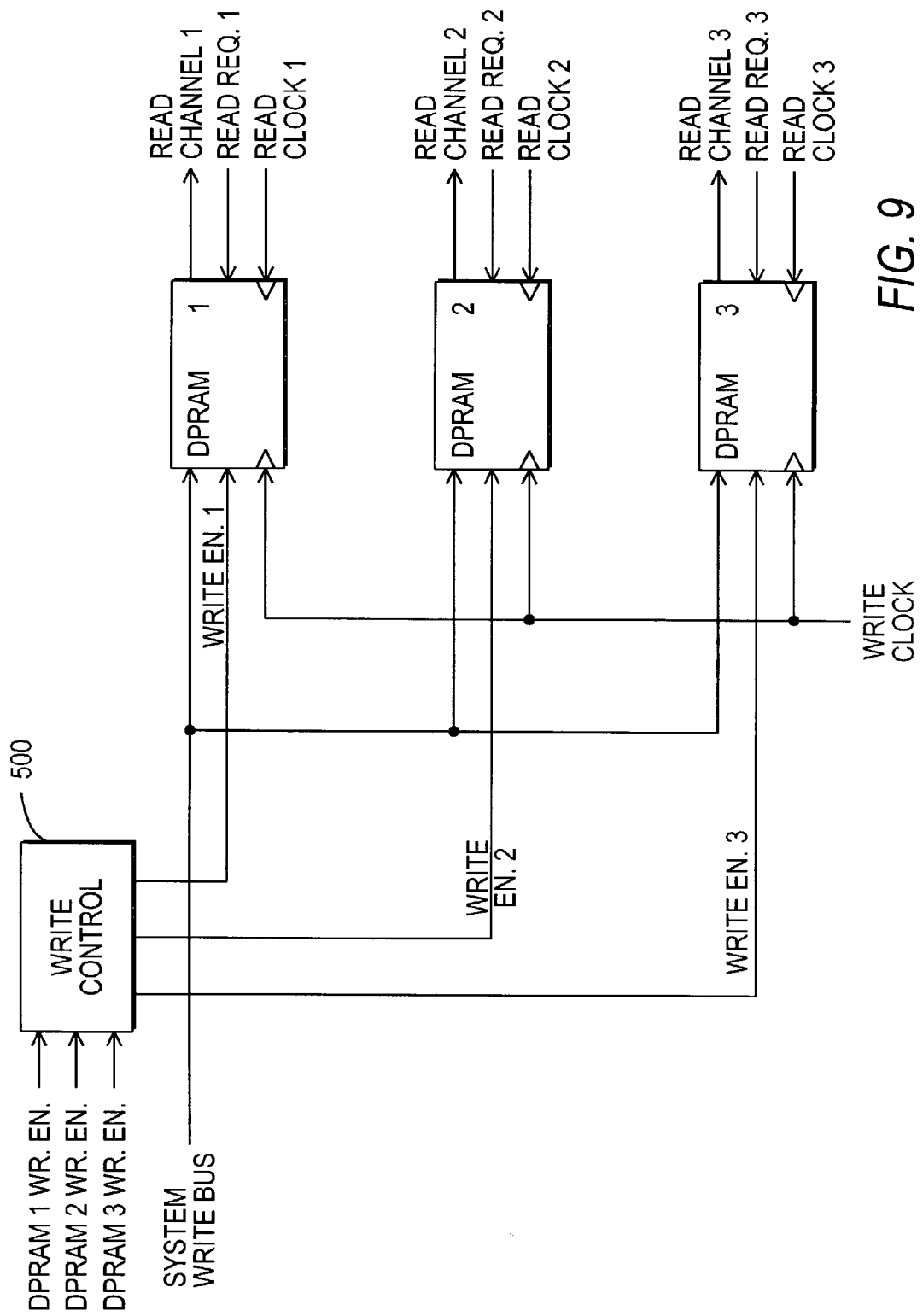

Returning once again to FIG. 5, the fifth option in the upper left-hand portion of screen 310 allows the user to specify that multiple DPRAMs subsequently specified have a common write port but separate read ports. FIG. 9 shows an example of this type of DPRAM arrangement. It will be seen that FIG. 9 is similar to FIG. 7, with DPRAMs 1–3 substituted for FIFOs 1–3 and with element 500 taking the place of element 450. Operation of the FIG. 9 circuitry is therefore somewhat similar to operation of the FIG. 7 circuitry, the major difference being that in FIG. 7 read and write addresses for FIFOs 1–3 are typically generated by counters associated with those FIFOs, whereas in FIG. 9 read and write addresses for DPRAMs 1–3 can come from non-counter sources.

Figure 14:
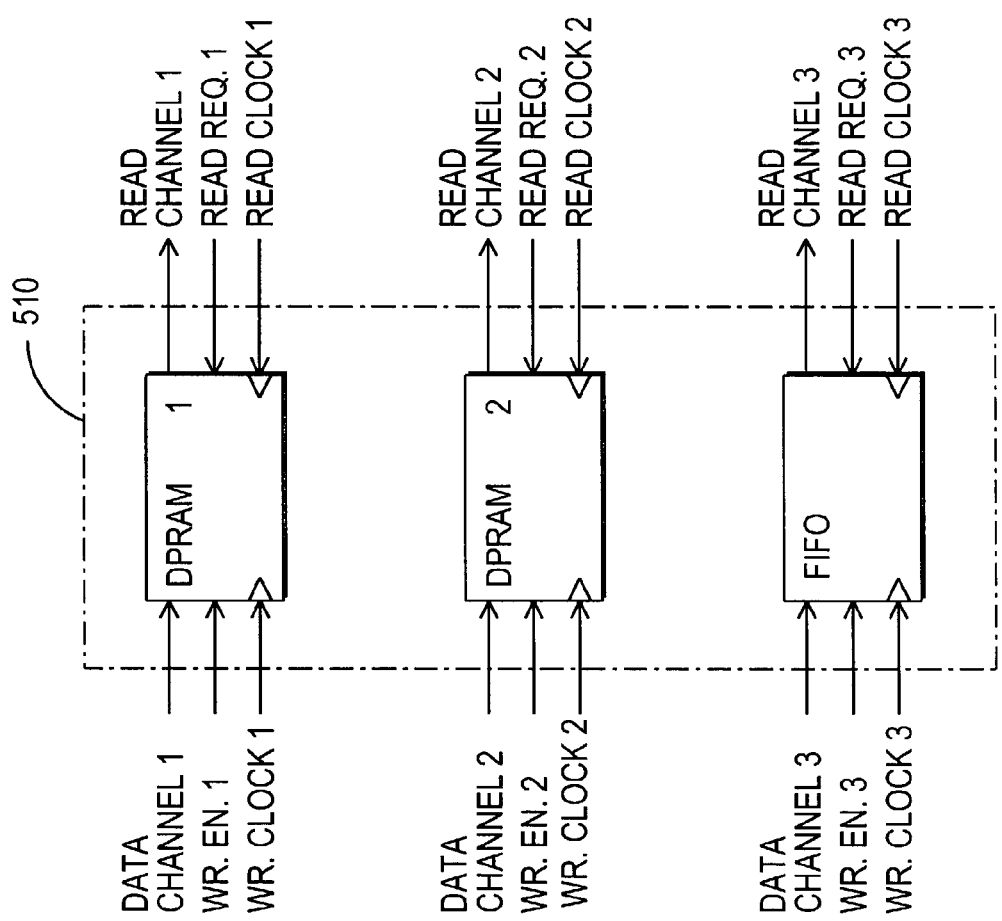
FIG. 14 is another simplified schematic block diagram similar to FIG. 6 showing yet another illustrative memory structure that can be implemented in accordance with the invention. This FIG. can also represent the user's perspective of individual functions maintaining individual controls despite the integration provided by this invention.

Although FIGS. 6–9 show several common bus modes that are supported by the illustrative embodiment, it should not be forgotten that the illustrative embodiment also supports combinations of FIFOs and DPRAMs that do not have common ports. This is the first option selectable in the upper left-hand portion of screen 310 (FIG. 5) as described earlier in this specification. An example of this type of memory arrangement is shown in FIG. 14. This illustrative memory arrangement includes two DPRAMs and one FIFO. Chain dotted line 510 indicates that all of these functional memories are included within one common physical memory 510 in accordance with this invention. Again, it should be understood that other embodiments are within the scope of the invention, including embodiments that can include true dual-port RAMs and single-port RAMs in similar arrangements of N:N, N:1, 1:N, and combinations thereof.

Returning once again to FIG. 5, the lower left-hand corner of screen 310 allows the user to enter such data as (1) the desired number of FIFOs, and (2) the desired number of DPRAMs. The lower left-hand corner of screen 310 also allows the user to specify use of the same configuration for all of the virtual elements (i.e., for all of the FIFOs and/or for all of the DPRAMs). The lower left-hand corner of screen 310 also allows the user to specify that all of the virtual elements have an asynchronous clear. If an asynchronous clear is provided, the user can specify that it is an active low asynchronous clear.

The right-hand portion of screen 310 is primarily a display of some summary information regarding the memory data that the user has entered via other computer screens that will be described later in this specification. Some examples of the kinds of information that is displayed in the right-hand portion of screen 310 are shown in FIG. 5. For example, in the table that includes the column headings "Virtual Element", "Write", and "Read", it is assumed that the user has entered data for four memories ("virtual elements") as follows: (1) a FIFO having a 10 MHz write clock and a 10 MHz read clock, (2) a FIFO having a 5 MHz write clock and a 15 MHz read clock, (3) a DPRAM having a 20 MHz write clock and a 20 MHz read clock, and (4) a DPRAM having a 50 MHz write clock and a 20 MHz read clock.

Below the above-described table on the right-hand side of screen 310 the total write frequency is displayed both numerically and in a scaled progress bar. For the exemplary data in the table above, the write frequency is 85 MHz. Below the write frequency display is a similar display of the total read frequency. For the exemplary data in the table above, the read frequency is 65 MHz. Below the displays of write and read frequencies, displays of other parameters may be provided. For example, a calculated frequency for a time division multiplexing ("TDM") clock or other integration data may be displayed. Near the upper right-hand corner of screen 310 is a window that allows the user to jump to other screens, such as those described later in this specification.

Figure 10:
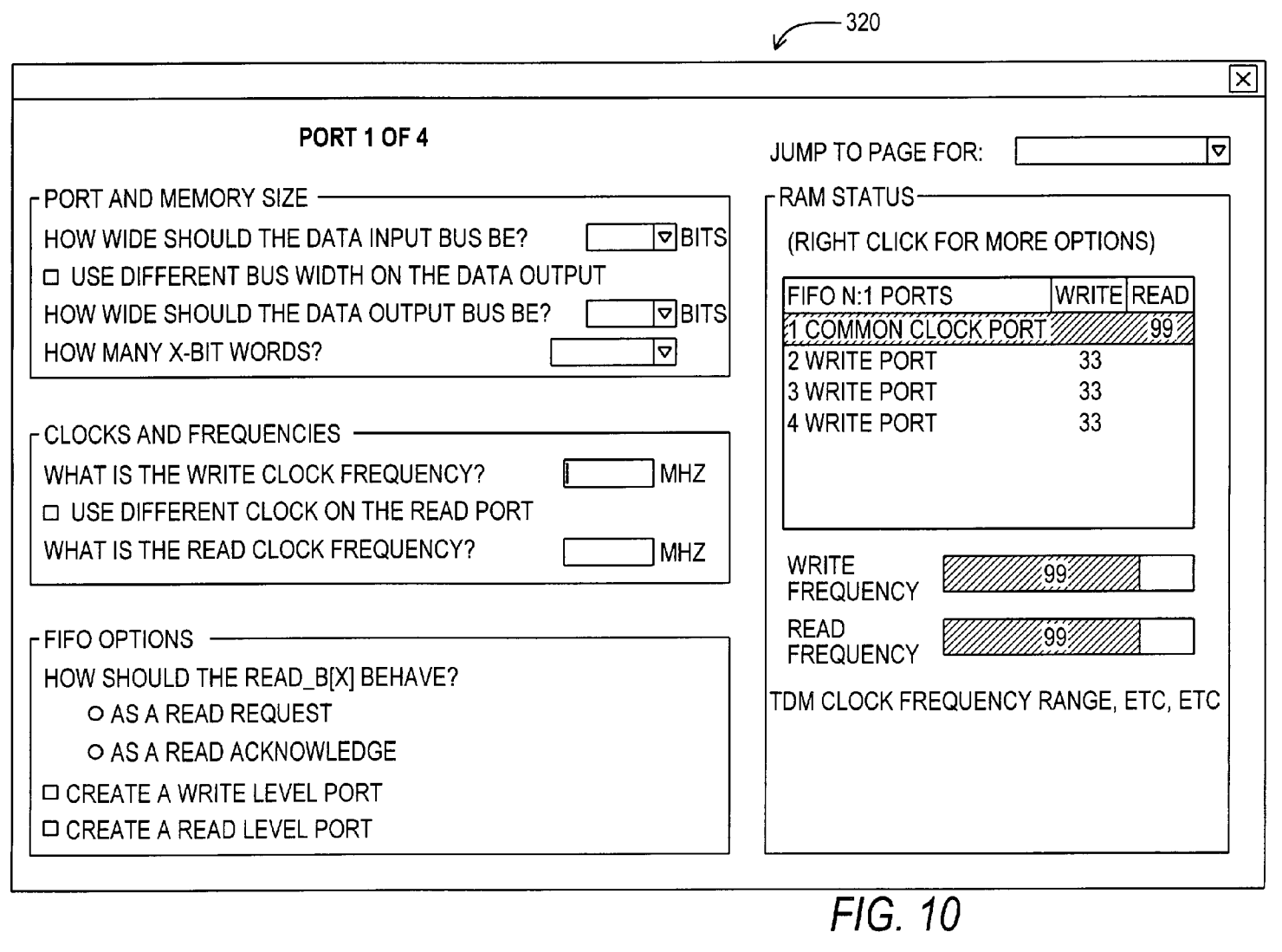

FIG. 10 shows an illustrative computer screen 320 for facilitating entry by the user of data for specifying a FIFO type of memory element. If the user wants several separate FIFOs, screen 320 is displayed to the user, and must be completed by the user, once for each of those FIFOs. (If in screen 310 the user indicated that the same configuration is to be used for all virtual elements, then screen 320 only needs to be displayed and completed once.) If the user wants FIFOs with a common read port (N:1) or with a common write port (1:N), screen 320 is displayed and must be completed N+1 times (i.e., once for each port of the N:1 or 1:N memory structure). (The number of times screen 320 is displayed in common port situations can be reduced to two if all of the FIFOs are the same (see the later discussion of FIG. 12).) Information regarding the common port is preferably requested before requesting information for the other ports. In cases involving common ports, during each display of screen 320, only portions of the screen may be enabled (i.e., the portions that are appropriate for entering information about the port type for which screen 320 is currently being displayed). To some extent FIG. 10 shows some examples of information that screen 320 may display based on data that the user has already entered. (This sample information is not consistent with the sample information shown in FIG. 5 because different examples are considered in these two FIGS.) For example, in the upper left portion of screen 320 the screen displays an indication that this display is for port 1 of a four-port memory structure (in this case a 3:1 FIFO memory structure (see also the exemplary information displayed on the right in FIG. 10)).

Continuing down the left-hand side of screen 320, near the top the screen calls for the user to enter port and memory size data. The first data requested is the width (in bits) of the data input bus. Below that the user is asked whether a different bus width is to be used on the data output. Only if that selection is made is the next question (data output bus width) enabled. The next question ("How many x-bit words?") allows the user to specify the depth of the memory. The place-holder "x" in this question will be changed to the number the user has specified for the input bus width.

The next group of questions on the left in screen 320 allows the user to enter data regarding clocks and frequencies. The first of these questions allows the user to specify the write clock frequency in MHz. Then the user is asked whether a different frequency is to be used for the read clock. Only if the different frequency option is selected is the next question ("What is the read clock frequency?") enabled to allow the user to enter a different read clock frequency (again, in MHz).

The lower left portion of screen 320 allows the user to select various options regarding how a FIFO will operate. For example, a control signal associated with a FIFO can be selected to be either a read request signal or a read acknowledge signal. Additionally, the user may choose to display word levels (the number of words in the FIFO) with respect to the read or write port clocks.

The right-hand portion of screen 320 is primarily a display of certain information the user has entered elsewhere. For example, the table with the column headings "FIFO N:1 Ports", "Write", and "Read" summarizes selected data about the ports of the FIFO arrangement that the user has specified. The exemplary data shown indicates that the user has specified a FIFO structure having (1) a common read port that will operate at 99 MHz, and (2) three write ports, each of which will operate at 33 MHz. If screen 320 was being provided for a 1:N FIFO structure, the left-hand column heading would change to indicate "1:N" rather than "N:1" as shown. Similarly, if screen 320 was being provided for one or more separate FIFOs, the left-hand column heading would change to just "FIFOs", and both the write and read clock rates for each FIFO would be reported on the line in the table for that FIFO.

Below the above-described table, screen 320 reports both the aggregate write frequency and the aggregate read frequency for the FIFO(s) or FIFO ports summarized in the table. These reports are in the form of both progress bars and numbers. For the exemplary data shown in the table, the aggregate write and read frequencies are both 99 MHz.

Below the just-mentioned reports, screen 320 may also display other calculated or previously entered data such as the TDM clock frequency required to support the memory structure the user has specified. This TDM frequency may be equal to or greater than the sum of the amounts entered for the individual functional memories, depending on various aspects of the memory configuration selected.

FIG. 11 shows an illustrative computer screen 330 for facilitating entry by the user of data for specifying a DPRAM type of memory element. If the user wants several separate DPRAMs, screen 330 is displayed to the user, and must be completed by the user, once for each of those DPRAMs. (If in screen 310 the user indicated that the same configuration is to be used for all virtual elements, then screen 330 only needs to be displayed and completed once.) If the user wants DPRAMs with a common read port (N:1) or with a common write port (1:N), screen 330 is displayed and must be completed N+1 times (i.e., once for each port of the N:1 or 1:N memory structure). (The number of times screen 330 is displayed in common port situations can be reduced to two if all of the DPRAMs are the same (see the later discussion of FIG. 12).) Information regarding the common port is preferably requested before requesting information for the other ports. In cases involving common ports, during each display of screen 330, only portions of the screen may be enabled (i.e., the portions that are appropriate for entering information about the port type for which screen 330 is currently being displayed). To some extent FIG. 11 shows some examples of information that screen 330 may display based on data that the user has already entered. (This sample information is not consistent with the sample information in FIGS. 5 and 10 because different examples are considered in these various FIGS.) For example, in the upper left portion of screen 330 the screen displays an indication that this display is for port 3 of a four-port memory structure (in this case a 1:3 DPRAM memory structure (see also the exemplary information displayed on the right in FIG. 11)).

Continuing down the left-hand side of screen 330, near the top the screen calls for the user to enter port and memory size data. This portion of screen 330 is similar to the corresponding portion of screen 320 and therefore does not need to be described again.

The next (middle) portion of the left-hand side of screen 330 calls for the user to enter clock and frequency data. This portion of screen 330 is again similar to the corresponding portion of screen 320 and therefore does not need repeated description.

The next (lower) portion of the left-hand side of screen 330 allows the user to select any of several optional features. One of these options allows creation of a clock enable signal for the read port. Another option allows creation of registers for the output of an N:1 DPRAM (e.g., optional registers for pipelining). Still another option allows creation of a byte enable port (e.g., so that only a selected part of a longer word will be written or read). If this item is selected, then the final item on the left-hand side of screen 330 allows the user to specify the width (in bits) of a byte.

The right-hand portion of screen 330 is primarily a display of certain information the user has entered elsewhere. For example, the table with the column headings "DPRAM 1:N Ports", "Write", and "Read" summarizes selected data about the ports of the DPRAM arrangement that the user has specified. The exemplary data shown indicates that the user has specified a DPRAM structure having (1) a common write port that will operate at 100 MHz, and (2) three read ports operating, respectively, at 10 MHz, 30 MHz, and 30 MHz. If screen 330 was being provided for an N:1 DPRAM structure, the left-hand column heading would change to indicate "N:1" rather than "1:N" as shown. Similarly, if screen 330 was being provided for one or more separate DPRAMs, the left-hand column heading would change to just "DPRAMs", and both the write and read clock rates for each DPRAM would be reported on the line in the table for that DPRAM. Below the above-described table, screen 330 reports both the aggregate write frequency and the aggregate read frequency for the DPRAM (s) or DPRAM ports summarized in the table. These reports are in the form of both progress bars and numbers. For the exemplary data shown in the table, the aggregate write and read frequencies are 100 MHz and 70 MHz, respectively.

Below the just-mentioned reports, screen 330 may also display other calculated or previously entered data such as the TDM clock frequency required to support the memory structure the user has specified. Once again, this TDM clock frequency may or may not equal the sum of the amounts entered for the individual functional memories, depending on various aspects of the memory configuration selected and/or any limitations of the physical implementation.

Figure 12:
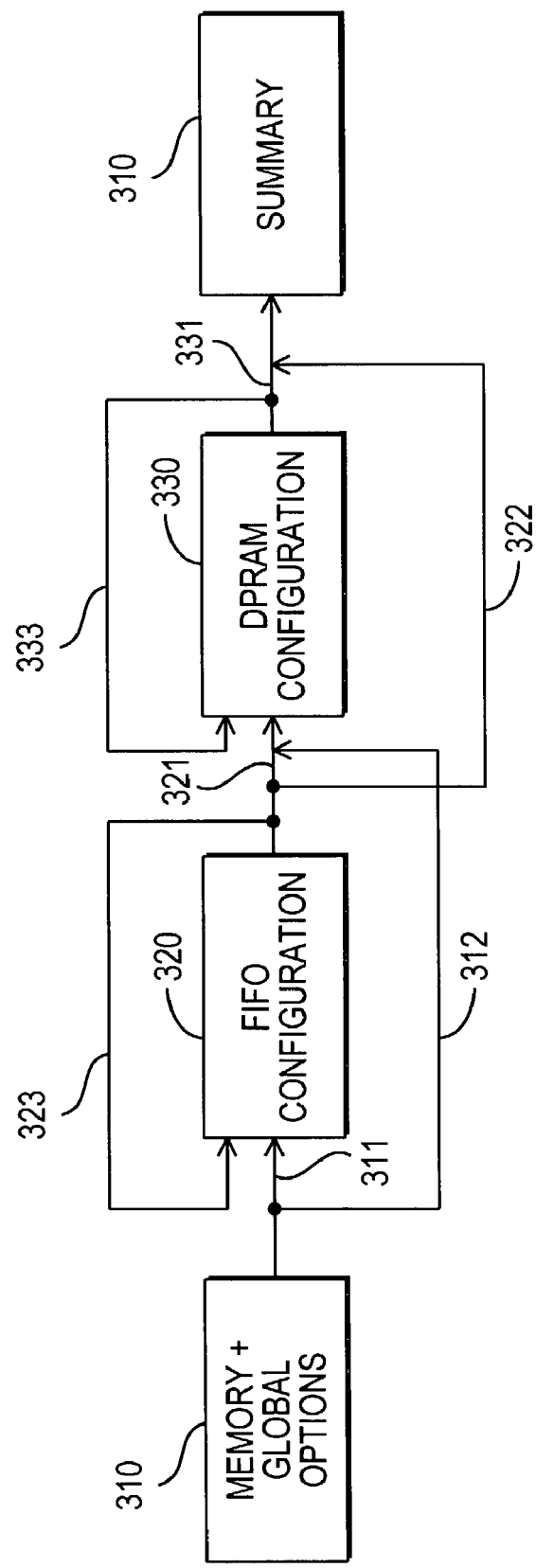
FIG. 12 is a simplified flow chart showing an illustrative embodiment of use of the computer screens of FIGS. 5, 10, and 11 in accordance with certain aspects of the invention.

FIG. 12 shows a typical flow through uses of screens 310, 320, and 330. Screen 310 is used first, thereby giving the user a chance to specify how many FIFOs and/or DPRAMs are desired, and also whether the FIFOs or DPRAMs have common input or output ports. If one or more FIFOs are desired, control passes from screen 310 to screen 320 via path 311. If no FIFOs are desired, control passes from screen 310 to screen 330 via path 312. If only one FIFO is desired (or if multiple but all identical FIFOs are desired), screen 320 is displayed only once. If multiple, different FIFOs are desired, screen 320 is displayed as many times as the desired number of FIFOs, looping back the appropriate number of times via path 323. Similarly, if a FIFO structure with a common port is desired, screen 320 is displayed as many times as the desired FIFO structure has ports, again looping back the appropriate number of times via path 323. (Again, if in a common port situation, all of the FIFOs are the same, screen 320 only needs to be displayed twice: once for the common port and once for the other port that has the same configuration for all the FIFOs.)

When use of screen 320 is finished, control passes from screen 320 to screen 330 via path 321 (if one or more DPRAMs are desired) or to screen 310 via path 322 (if no DPRAMs are desired). Assuming at least some use of screen 330, if only one DPRAM is desired, screen 330 is displayed only once. If multiple DPRAMs are desired, screen 330 is displayed as many times as the desired number of DPRAMs, looping back the appropriate number of times via path 333.

Similarly, if a DPRAM structure with a common port is desired, screen 330 is displayed as many times as the desired DPRAM structure has ports, again looping back the appropriate number of times via path 333. (If in a common port situation, all of the DPRAMs are the same, screen 330 only needs to be displayed twice: once for the common port and once for the other port that has the same configuration for all of the DPRAMs.)

When use of screen 330 is finished, control passes from screen 330 to screen 310 via path 331. Alternatively (as has been mentioned) control may pass from screen 320 to screen 310 via path 322 if screen 330 is not needed and can be bypassed. The use of screen 310 from path 331 or 322 is so that the user can see the completed, right-hand, summary side of screen 310.

In addition to the basic flow through screens 310, 320, and 330 shown in FIG. 12, it will be understood that the user may command jumps from screen to screen (e.g., to correct or change data previously entered, to enter data in a different order than the system normally follows by itself as an automatic matter, etc.)

Returning to FIG. 4, screens 310, 320, and 330 (FIGS. 5, 10, and 11, as well as other FIGS. and the above, related discussion) show an illustrative embodiment of how and what data is collected regarding the user's memory needs per step 200 in FIG. 4. For example this data includes information relating to (1) type or functionality of each memory element (e.g., whether it is a FIFO, a DPRAM, etc.), (2) data size (e.g., input width, output width, depth, etc.), (3) clock rates, and (4) other configurational aspects that can help with optimization of the design of the logic needed to support implementing all of the various memory elements in common memory (e.g., information regarding common bus mode common clock, phase-related clocks, etc.).

Figure 13:
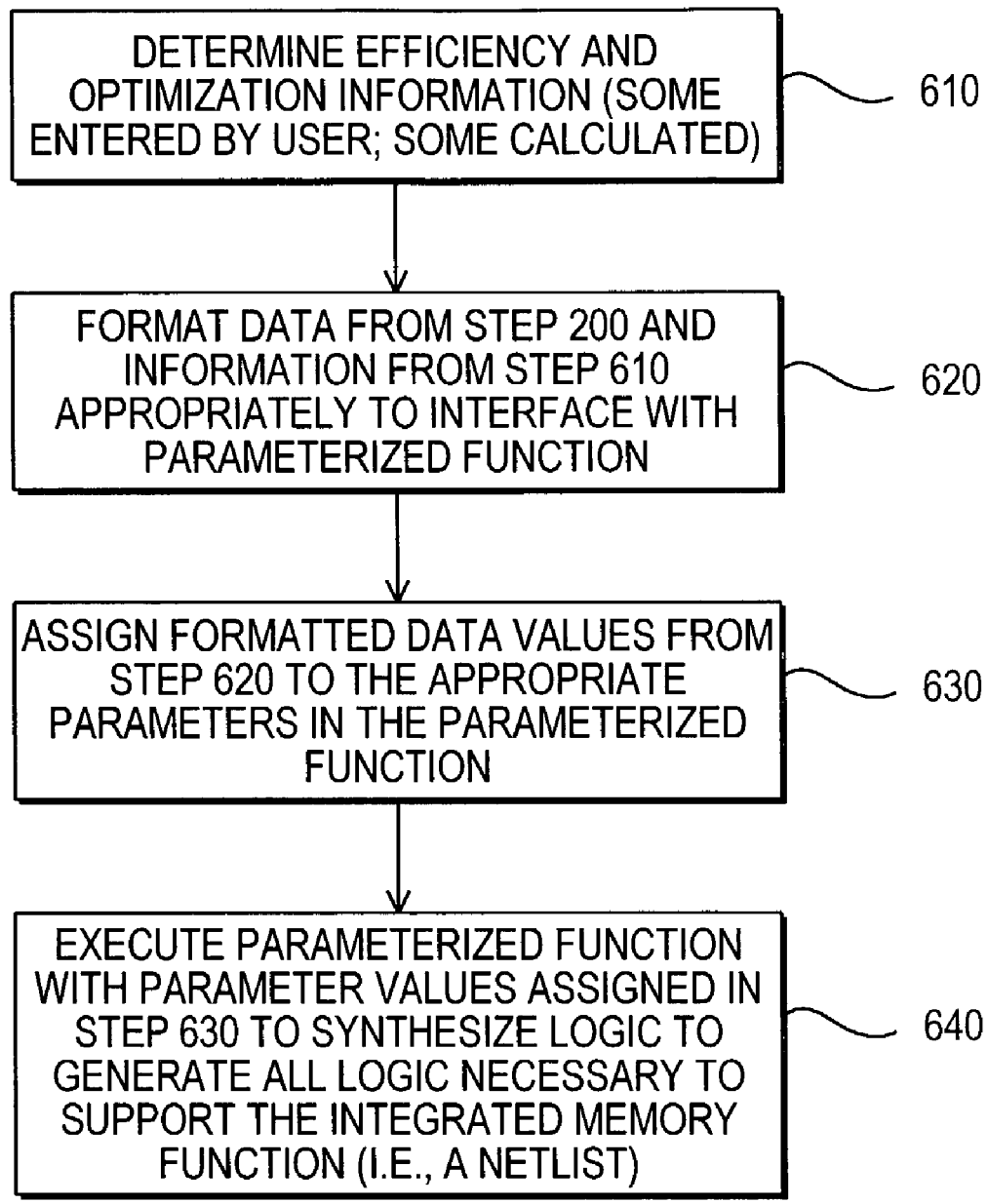
FIG. 13 is a more detailed, but still simplified, flow chart of an illustrative embodiment of a portion of FIG. 4 in accordance with the invention.

Step 210 can be implemented as shown in more detail in the illustrative embodiment of FIG. 13. In step 610 information related to efficiently/optimally implementing the desired memory structures in common memory is determined. Some of this information may have been entered by the user. For example, the common bus mode information (N:1 or 1:N) entered by the user is useful in efficiently/optimally implementing multiple memories having a common port in common memory. Some of this information may be calculated automatically as part of step 610. For example, the TDM clock rate(s) can be calculated from the clock rates of the various memory functions sharing a common port or ports of common memory. This calculation can be influenced by information input by the user. For example, if the user has input requests for a 150 MHz channel and two 25 MHz channels, all of which are synchronized with one another (either because such synchronization is always assumed by the embodiment of the invention, or because the user has input information that there is such synchronism), then in step 610 it can be calculated that the TDM clock rate for these three channels can be 200 MHz. Moreover, it follows from this calculation that in every eight TDM clock cycles, six cycles should be allocated to the 150 MHz channel, and each of the two remaining TDM clock cycles should be allocated to a respective one of the two 25 MHz channels. If the channels are not synchronized with one another, then another conventional algorithm can be used to determine an appropriate TDM clock rate and how cycles in that clock rate should be allocated among the various channels.

In step 620 data from step 200 (FIG. 4) and information from step 610 is formatted appropriately to interface with a parameterized function. The parameterized function is generic to producing a design for logic to support any of the allowed numbers and combinations of memory functions in common physical memory. It is "parameterized" because it does not initially include actual values for the parameters that are needed to actually produce a particular design. Thus step 620 organizes and formats the mentioned data and information so that this data and information can be associated with and become the actual values for the various parameters in the parameterized function.

In step 630 the formatted data values from step 620 are assigned to the appropriate parameters in the parameterized function. In other words, performance of step 630 gives actual values to all the necessary parameters in the parameterized function. These values are, of course, the values appropriate to the particular set of memory functions the user has requested, as well as constraining the generic, parameterized form of the parameterized function that implements the integrated memory and logic needed.

In step 640 the parameterized function is executed with the parameter values assigned in step 630. This allows the parameterized function to generate the logic needed to provide an integrated memory that will provide all the various memory functionalities the user has requested. In particular, the parameterized function outputs a netlist for this synthesized logic and the associated common (integrated) memory. For purposes of this disclosure, "netlist" is a form of the parameterized function that may or may not require further processing in order to be implemented in a PLD (e.g., it might be hardware descriptive language such as VHDL or Verilog that would need further synthesis to achieve a gate-level representation). After step 640 has been performed, processing can continue as shown at step 220 in FIG. 4. The result of performing step 220 is a larger netlist for everything needed on the PLD (i.e., including the netlist information from step 640). Once a full netlist is available from step 220, each of steps 230 and 240 can be conventional and performed, per se, conventionally.

It will be understood that the foregoing is only illustrative of the principles of the invention, and that various modifications can be made by those skilled in the art without departing from the scope and spirit of the invention. For example, although the invention has been described for the most part in its application to PLDs, it will be understood from this description how the invention can be applied to the design of many other types of systems in which it may be desired to have multiple memory functions share common memory.

The invention claimed is:

1. A method of collecting data for use in providing a circuit design in which multiple memory functions share common physical memory circuitry comprising:

allowing a user to input data specifying type information for each of the multiple memory functions, the memory functions including at least one of dual-port random access memory and first-in/first-out memory, wherein the type information relates to a provision of optional registers for data from a memory function for pipelining, wherein the type information relates to provision of a common read port and a common write port for the multiple memory functions, and further wherein the type information relates to independently operating memory functions;

allowing the user to input data specifying size information for each of the multiple memory functions; and allowing the user to input data specifying operating speed information for each of the multiple memory functions.

2. The method defined in claim 1 wherein the memory functions further include true dual-port random access memory and single-port random access memory.

3. The method defined in claim 1 wherein the size information comprises input port width and output port width.

4. The method defined in claim 3 wherein the size information further comprises memory depth.

5. The method defined in claim 1 wherein the operating speed information comprises input port speed and output port speed.

6. The method defined in claim 1 wherein the type information is selected in part from the group consisting of provision of a read request signal and provision of a read acknowledge signal.

7. A method of collecting data for use in providing a circuit design in which multiple memory functions share common physical memory circuitry comprising:

allowing a user to input data specifying type information for each of the multiple memory functions, the memory functions including at least one of dual-port random access memory and first-in/first-out memory, wherein the type information relates to a provision of optional registers for data from a memory function for pipelining, wherein the type information relates to provision of a common read port and a common write port for the multiple memory functions, and further wherein the type information relates to provision of a byte enable port allowing the user to specify the width of a byte;

allowing the user to input data specifying size information for each of the multiple memory functions; and allowing the user to input data specifying operating speed information for each of the multiple memory functions.

8. A method of collecting data for use in providing a circuit design in which multiple memory functions share common physical memory circuitry comprising:

allowing a user to input data specifying type information for each of the multiple memory functions, the memory functions including at least one of dual-port random access memory and first-in/first-out memory, wherein the type information relates to a provision of optional registers for data from a memory function for pipelining, wherein the type information relates to provision of a common read port and a common write port for the multiple memory functions, and further wherein the type information relates to provision of a clear signal for the multiple memory functions;

allowing the user to input data specifying size information for each of the multiple memory functions; and allowing the user to input data specifying operating speed information for each of the multiple memory functions.

\* \* \* \* \*